United States Patent [19]

Smith

[11] Patent Number: 5,283,759
[45] Date of Patent: Feb. 1, 1994

[54] ONE-TIME-PROGRAMMABLE EEPROM CELL

[75] Inventor: Stuart Smith, München, Fed. Rep. of Germany

[73] Assignee: Eurosil Electronic GmbH, Eching, Fed. Rep. of Germany

[21] Appl. No.: 900,482

[22] Filed: Jun. 18, 1992

[30] Foreign Application Priority Data

Jun. 26, 1991 [DE] Fed. Rep. of Germany ....... 4121053

[51] Int. Cl.⁵ .............................................. G11C 16/02
[52] U.S. Cl. ...................................... 365/185; 365/104
[58] Field of Search .............................. 365/104, 185

[56] References Cited

U.S. PATENT DOCUMENTS

| | | | |
|---|---|---|---|
| 4,811,287 | 3/1989 | Kupersmith et al. | 365/52 |
| 4,878,199 | 10/1989 | Mitzutani | 365/185 |
| 4,975,878 | 12/1990 | Boddu et al. | 365/189.07 |
| 5,170,373 | 12/1992 | Doyle et al. | 365/104 X |
| 5,185,718 | 2/1993 | Rinerson et al. | 365/185 |

FOREIGN PATENT DOCUMENTS 3702453  8/1988  Fed. Rep. of Germany .

OTHER PUBLICATIONS

Elektronik Notizen: "'Plastik-EPROMs' sollen ROMs ablösen"; Elektronik 24, Nov. 29, 1985.
IEEE Journal of Solid-State Circuits, vol. SC-20, No. 5, Oct. 1985; "A 25-ns 16K CMOS PROM Using ...", S. Pathak et al.

*Primary Examiner*—Eugene R. LaRoche
*Assistant Examiner*—Do Hyun Yoo
*Attorney, Agent, or Firm*—Spencer, Frank & Schneider

[57] ABSTRACT

The invention relates to a one-time-programmable read-only memory cell, abbreviated as PROM. According to the prior art, PROM cells are programmed by the deliberate destruction of a component. Since the information is burnt into the memory cell in this way, a PROM cell can only be programmed once. If read-only memory cells are to be electrically programmed and cleared several times, floating gate transistors in particular are used. With the floating gate transistor, the information is stored as a charge on a completely insulated gate electrode. If PROM and EEPROM memory cells are now integrated on a common chip, this requires additional circuitry due to the different voltage requirements of the two different memory cells. In accordance with the invention, a repeatedly electrically programmable read-only memory is connected such that it can only be electrically programmed once.

12 Claims, 1 Drawing Sheet

ONE-TIME-PROGRAMMABLE EEPROM CELL

FIELD OF THE INVENTION

The invention relates to a one-time-programmable memory cell, i.e. a memory cell that can only be electrically programmed once.

For this purpose, programmable read-only memories, known as PROMs, are used in accordance with the prior art. PROM cells in their unprogrammed state comprise an array of diodes or transistors with electrically destructible connections and means for destruction of these connections. When a memory cell is programmed, the connection is destroyed by a current surge and the memory cell is thereby permanently altered. Reprogramming is not possible. If it is necessary to reprogram a read-only memory cell more than once, EEPROM cells are used. These cells essentially comprise a floating gate memory transistor and a selection transistor. The floating gate transistor has between its channel zone and control gate a further completely insulated gate electrode. Programming is achieved by application of a high positive voltage between the drain electrode and the control gate. In the strong electrical field, the electrons transfer from the floating gate to the drain connection by the tunnel effect. The floating gate is thereby positively charged, so that the transistor remains low-resistance after removal of the programming voltage between source and drain. Reprogramming is achieved by reversing the programming voltage between the drain connection and the control gate. Electrons tunnel in the strong electrical field through the oxide layer to the floating gate electrode. Once the programming voltage is absent, the floating gate transistor is high-resistance between the source and the drain. EEPROM cells can be programmed as often as required in this way.

If PROM and EEPROM cells are now integrated on a common chip, this entails additional circuitry due to the different voltage requirements of the two different memory cells. In addition, PROM cells require large driver transistors that supply high currents for melting through the electrical connections.

The object of the invention is therefore to avoid the above drawbacks in the common integration of one-time-programmable read-only memories (PROMs) and electrically erasable programmable read-only memories (EEPROMs).

SUMMARY OF THE INVENTION

This object is attained generally by the use of a floating gate MOS transistor as generally provided in an EEPROM as a read only memory which is electrically programmable once only in that its bulk connection and its control gate connection are connected to a line for the application of the programming voltage according to claim 1. Advantageous embodiments of the inventions are described in the supplementary claims and sub-claims.

DETAILED DESCRIPTION OF THE PREFERRED EMBODIMENT

The following explains the invention on the basis of an embodiment.

Figure 1:
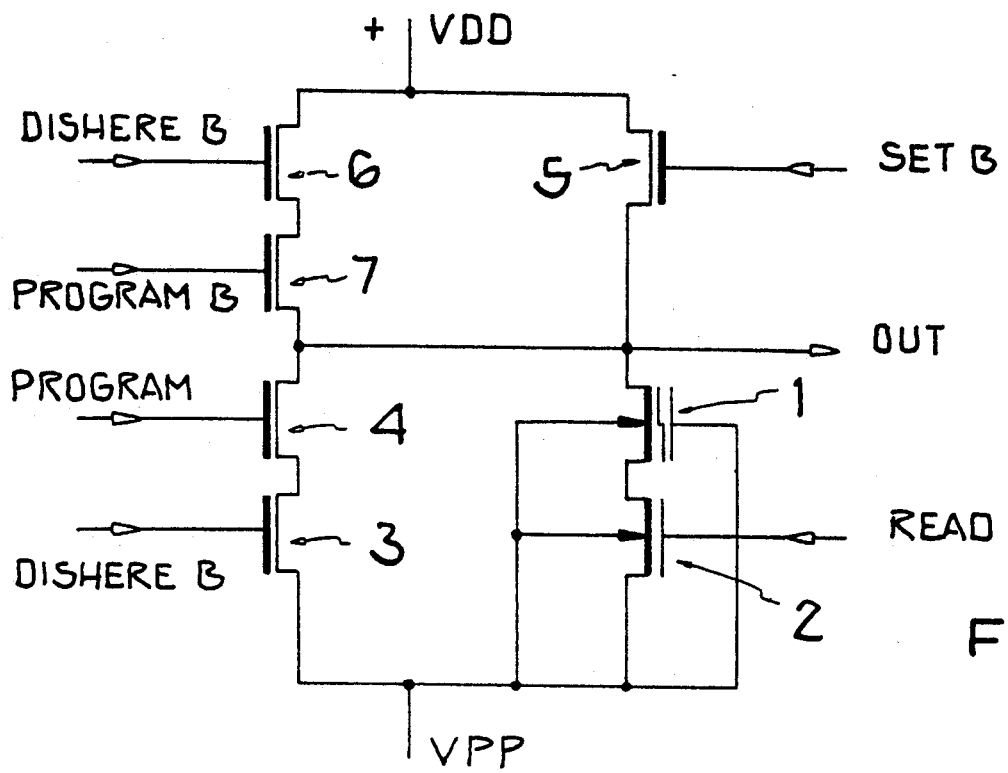
FIG. 1 shows a circuit diagram of a read-only memory in accordance with the invention.

FIG. 1 shows the circuit diagram of an array in accordance with the invention with a floating gate transistor 1 usual for EEPROM cells. The array cannot however be used as an EEPROM cell, but only as a one-time-programmable PROM cell. As a result of the circuits in the floating gate transistor 1, the positive charge when once applied to the floating gate can no longer be removed. The cell therefore remains permanently programmed.

The control gate connection and the bulk connection of the floating gate transistor 1 are connected to the VPP line. The source connection of the floating gate transistor 1 is connected via the source-drain path of a first n-channel MOS transistor 2 to the VPP line. A READ signal is supplied to the first n-channel MOS transistor 2 at its gate connection. The drain connection of the floating gate transistor 1 is connected via the source-drain path of a first p-channel MOS transistor 5 to the VDD connection. At its gate connection, a SETB signal is supplied to the first p-channel MOS transistor 5. The drain connection of the floating gate transistor 1 is in addition connected to the VPP line by a first series circuit comprising the source-drain paths of a second and a third n-channel MOS transistor 3, 4. At its gate connection, the second n-channel MOS transistor 4 is supplied with a program signal and the third n-channel MOS transistor 3 with a DISHEREB signal. A second series circuit comprising the source-drain paths of a second and a third p-channel MOS transistor 6, 7 connects the drain connection of the floating gate transistor 1 to the VDD connection. At its gate connection, the second p-channel MOS transistor 7 is supplied with a PROGRAMB signal and the third p-channel MOS transistor 6 with the DISHEREB signal. The output of the memory cell OUT is also located at the drain connection of the floating gate transistor 1. The VPP connection is normally grounded to VSS and changes to $-17$ V in relation to VDD during programming. DISHEREB is an active-low signal that is normally at VDD and changes to $-17$ V when this cell is to be programmed. PROGRAM and PROGRAMB are active-high and active-low versions of the same signal. PROGRAM changes to VDD when the VPP connection is connected to a lower potential than VSS or ground. This is the case when programming voltage is applied. During programming, READ is at VPP and SETB at VDD, meaning that both signals are inactive. The function of the signals during readout of the memory cell is dealt with below. In the event that further EEPROM cells are to be programmed, but not this cell, DISHEREB remains inactive at VDD potential. The VPP line changes to $-17$ V programming voltage, hence PROGRAM is at VDD and PROGRAMB at $-17$ V or ground potential. This leads to the second and third n-channel MOS transistors 4, 3 and the second p-channel MOS transistor 7 conducting and the third p-channel MOS transistor 6 blocking. In the case of the floating gate transistor 1, the drain, bulk and control gate connections are at the same potential, i.e. $-17$ V. No potential change in the floating gate electrode therefore occurs. The floating gate transistor remains unprogrammed.

If the cell is to be programmed, the signal DISHEREB changes to −17 V additionally. In this case, the second n-channel MOS transistor 4 and the second and third p-channel MOS transistors 7, 6 conduct, while the third n-channel MOS transistor 3 blocks. The drain electrode of the floating gate transistor 1 is hence at the potential of the supply voltage VDD, while the bulk and control gates are connected via the VPP line to the −17 V programming voltage. The floating gate is positively charged by the tunnel current and the floating gate transistor 1 is permanently conducting. The structure of the circuit ensures that the control gate electrode is not at the supply voltage potential VDD while the programming voltage is being applied to the drain connection. Since the control gate is permanently connected to the VPP line, programming voltage is always applied to the control gate during programming. A charge cannot be removed once it has been applied to the floating gate. The cell can therefore only be programmed once.

When reading the memory cell, all signals are initially at their normal potential as described above. The signal SETB is briefly active (low). As a result, the first p-channel MOS transistor 5 conducts and connects the drain electrodes of the floating gate transistor 1 to the supply voltage VDD. A weak, active feedback, not shown for clarity's sake, keeps the drain electrode of the floating gate transistor 1 at VDD potential. In the next step, the READ signal is active, i.e. set to VDD. The first n-channel MOS transistor 2 conducts and connects the source electrode of the floating gate transistor 1 to the ground potential applied to the VPP line. If the floating gate transistor 1 is unprogrammed, its source-drain path is high-resistance and the VDD potential at the output OUT of the memory cell is retained. If however the floating gate transistor 1 is programmed, its source-drain path is low-resistance and the output OUT is drawn to VPP potential via the source-drain path of the first n-channel MOS transistor 2. There is then no voltage being applied to the output OUT of the memory cell.

A read-only memory cell programmable only once in this way is distinguished particularly by the fact that the same individual elements are used as in a standard EEPROM cell that can be programmed several times. It is therefore possible without additional effort to integrate both one-time-programmable and repeatedly programmable read-only memories on the chip.

Figure 2:
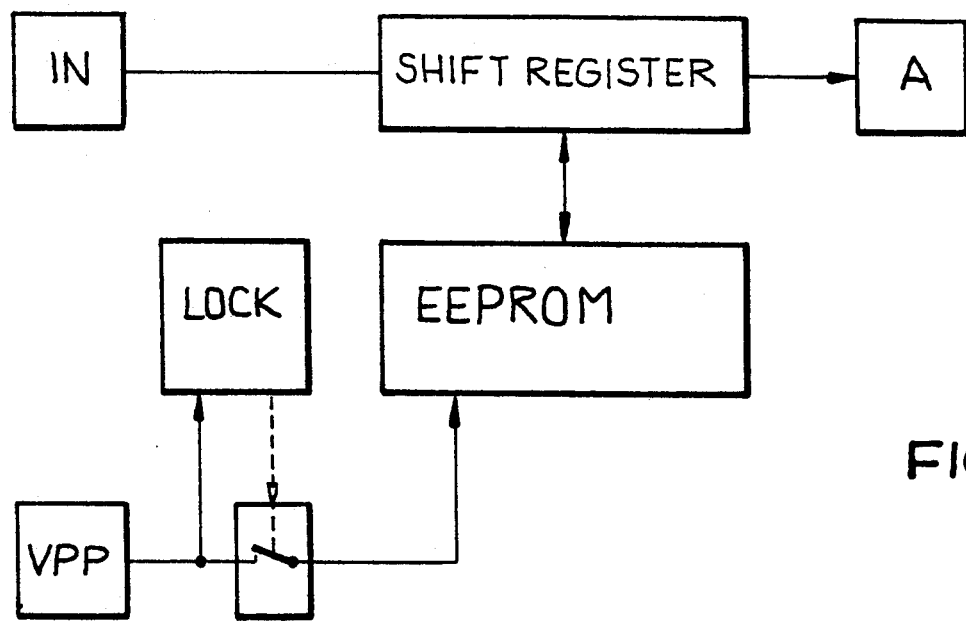
FIG. 2 shows the use of the read-only memory in accordance with the invention as a write-protect

FIG. 2 shows a block diagram of an array in which one-time-programmable and repeatedly programmable memory cells are used. From the input IN, the data pass first to a shift register. From there, they are transferred to the EEPROM when the programming voltage VPP is applied, and stored there. Furthermore, a one-time-programmable memory cell of the type described above is provided (lock). This cell controls a circuit block that passes the programming voltage to the EEPROM cells. As long as the one-time-programmable cell (lock) has not been programmed, the EEPROM cells can be re-programmed as often as required. However, once the one-time-programmable cell is programmed, no further programming voltage is supplied to the EEPROM cells, so that further programming of the EEPROMs is prevented. In this way, a simple write-protect is feasible for the EEPROMs. A further advantageous embodiment of the invention provides for division of the EEPROM array into a number of blocks, to each of which the programming voltage is supplied separately, and for a one-time-programmable memory cell to be provided for each of these blocks and to serve as a write-protect for the respective EEPROM block. This permits various memory areas to be provided with a write-protect at different times.

The invention is used to advantage for identification ICs in which the data stored in an EEPROM must be permanently write-protected after a programming and testing phase.

What is claimed is:

1. A one-time electrically programmable read-only memory comprising:
a floating gate MOS transistor serving as a physical memory element and having a source connection, a drain connection, a bulk connection and a control gate connection, with said control gate and said bulk connections being connected to a common line for a programming voltage (VPP), and circuit means for supplying the drain connection of said floating gate transistor with a supply voltage during programming, with said circuit means comprising a series circuit of a first and a second MOS transistor connected between said drain connection and a supply voltage terminal and having respective control gates for receiving respective control signals.

2. A circuit array having a one-time electrically programmable read-only memory according to claim 1, wherein an array of EEPROM cells is provided, wherein the programming voltage (VPP) is supplied to said EEPROM cells via a circuit component controlled by said one-time electrically programmable read-only memory, and said one-time electrically programmable read-only memory is in the programmed state.

3. A one-time electrically programmable read-only memory according to claim 1 wherein said first and second MOS transistors have the same channel conductivity type.

4. A one-time electrically programmable read-only memory according to claim 3 wherein said first and second MOS transistors are p-channel transistors.

5. A one-time electrically programmable read-only memory according to claim 1 further comprising further circuit means for selectively preventing programming of said floating gate transistor when said first and second transistors are conductive, with said further circuit means including at least one further MOS transistor connecting said drain connection of said floating gate transistor to said common line for a programming voltage (VPP).

6. A one-time electrically programmable read-only memory according to claim 5 wherein said at least one further MOS transistor comprises third and fourth series connected MOS transistors having respective control gates for receiving respective control signals.

7. A one-time electrically programmable read-only memory according to claim 6 wherein said first and second MOS transistors are of the same channel conductivity type and said third and fourth MOS transistors are of the opposite channel conductivity type, and wherein one control gate of said first and second transistors and one control gate of said third and fourth transistors receive the same control signal.

8. A one-time electrically programmable read-only memory according to claim 7 wherein said first and second transistors are p-channel transistors and said third and forth transistors are n-channel transistors.

9. A one-time electrically programmable read-only memory according to claim 8 further comprising circuit means for reading the floating gate transistor including a fifth MOS transistor having a source-drain path connecting said supply voltage terminal, and a sixth MOS transistor having a source-drain path connecting the source connection of said floating gate transistor to said common line, with said fifth and sixth transistors each being responsive to a control signal at its control gate to render same conductive during read out.

10. A one-time electrically programmable read-only memory according to claim 9 wherein said fifth transistor is a p-channel transistor and said sixth transistor is an n-channel transistor.

11. A one-time electrically programmable read-only memory according to claim 1 further comprising circuit means for reading the floating gate transistor including a third MOS transistor having a source-drain path connecting said drain connection of said floating gate transistor to said supply voltage terminal, and a fourth MOS transistor having a source-drain path connecting the source connection of said floating gate transistor to said common line, with said third and fourth transistors each being responsive to a control signal at its control gate to render same conductive during read out.

12. A one-time electrically programmable read-only memory according to claim 11 wherein said third transistor is a p-channel transistor and said fourth transistor is an n-channel transistor.

* * * * *